(12) United States Patent
Choe

(10) Patent No.: US 6,373,292 B1
(45) Date of Patent: Apr. 16, 2002

(54) LOW VOLTAGE DIFFERENTIAL LOGIC

(75) Inventor: Swee Yew Choe, Singapore (SG)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/467,547

(22) Filed: Dec. 10, 1999

(51) Int. Cl.$^7$ .................. H03K 19/20; H03K 19/094
(52) U.S. Cl. ................. 326/121; 326/83; 327/55; 327/67
(58) Field of Search .............. 326/83, 86, 95, 326/98, 112, 121, 119; 327/54, 57, 55, 67

(56) References Cited

U.S. PATENT DOCUMENTS 5,859,548 A * 1/1999 Kong ..................... 326/113
6,016,065 A * 1/2000 Kong ..................... 326/121

OTHER PUBLICATIONS

Bai–Sun Kong et al., "Charge Recycling Differential Logic for Low–Power Application," IEEE International Solid–State Conference, Feb. 1996.

Swee Yew Choe et al., "Half–Rail Differential Logic," IEEE International Solid–State Circuits Conference, Feb. 1997.

Swee Yew Choe et al., "Dynamic Half Rail Differential Logic for Low Power," Jun. 1997.

* cited by examiner

Primary Examiner—Michael Tokar
Assistant Examiner—Daniel D. Chang
(74) Attorney, Agent, or Firm—Marilyn E. Glaubensklee

(57) ABSTRACT

A low voltage differential circuit is described herein including a complementary logic tree having first, second and third inputs and two outputs, the logic tree for performing a desired logical function on signals received the the first input, thereby opening a pathway for current flow between at least one of the following: the second input and the first output, the second input and the second output, the third input and the first output, the third input and the second output. The circuit further includes a first transistor having a first gate, a first source, and a first drain, the first drain connected to the first output, the first source being connected to a supply voltage, a second transistor having a second gate, a second source, and a second drain, the second source connected to the first gate, the second drain connected to the first drain; and a third transistor having a third gate, a third source, and a third drain, the third source being connected to a supply voltage, the third gate being connected to the second drain, the third drain connected to the second source and the second output.

18 Claims, 5 Drawing Sheets

LOW VOLTAGE DIFFERENTIAL LOGIC

BACKGROUND OF THE INVENTION

1. Field of the Invention

The present invention relates to high-speed electronic circuits. More particularly, the present invention provides a low-power, high speed VLSI apparatus using voltage scaling.

2. The Background Art

Increasing demands for smaller, better, and faster electronic circuits having increasingly greater levels of functionality in a smaller package have caused the power consumption of those circuits to become an increasingly critical factor in circuit design.

In most integrated circuits, it is considered beneficial to minimize the power consumption of individual circuits making up a system. Prior art VLSI systems use charge recycling differential logic (CRDL) circuits to transmit information from one location in an integrated circuit to another. One example of such a CRDL circuit is shown in FIG. 1.

Referring to FIG. 1, CRDL circuit 10 includes transistors 12, 14, 16, 18, 20, 22, 24, 26 and 28. As with other dynamic circuits, circuit 10 operates in two phases, a precharge phase, and an evaluation phase. In the precharge phase, clock line 30 is high, connecting output nodes 32 and 34 together through NMOS transistor 28. The precharge voltage at the pull-up node is roughly half the supply voltage.

In the evaluation phase, the clock signal is low, turning transistor 28 off which breaks the connection between the gates of transistors 12 and 14. As the voltage level of one of the precharged output nodes 32 or 34 begins to go low, the other node is pulled high by the cross-coupled pair of PMOS transistors. An enable signal going high at this time on enable line 36 turns on transistor 24 accelerating the pull-down. At the same time, one of transistors 16 or 22 turns on enable output 38 so the next stage circuit may be enabled.

While prior art circuits such as that seen in FIG. 1 are useful for their intended purpose, the supply voltages required to operate the circuit are higher than necessary and therefore cause unnecessary power consumption. The supply voltages required for the circuits just described are four to five times the threshold voltage of the transistors employed in the design. Therefore, it would be beneficial to provide circuitry which performs the same function while consuming much less power by lowering the required supply voltage to a value less than four times the threshold voltage.

SUMMARY OF THE INVENTION

A low voltage differential circuit is described herein including a complementary logic tree having first, second and third inputs and two outputs, the logic tree for performing a desired logical function on signals received at the first input, thereby opening a pathway for current flow between at least one of the following: the second input and the first output, the second input and the second output, the third input and the first output, the third input and the second output. The circuit further includes a first transistor having a first gate, a first source, and a first drain, the first drain connected to the first output, the first source being connected to a supply voltage, a second transistor having a second gate, a second source, and a second drain, the second source connected to the first gate, the second drain connected to the first drain; and a third transistor having a third gate, a third source, and a third drain, the third source being connected to a supply voltage, the third gate being connected to the second drain, the third drain connected to the second source and the second output.

DETAILED DESCRIPTION OF ONE EMBODIMENT

Those of ordinary skill in the art will realize that the following description of the present invention is illustrative only and not in any way limiting. Other embodiments of the invention will readily suggest themselves to such skilled persons who are familiar with this disclosure.

The present invention provides a high-speed CMOS circuit for performing logical functions but which consumes significantly less power than prior art circuits. It operates in two phases, precharge and evaluate. The precharge phase is when the clock signal inputs are at a logical low. The evaluate phase is when the clock signal inputs are at a logical high.

The supply voltage for prior art circuits is typically four to five times the threshold voltage of included transistors. However, the supply voltage for one embodiment of the present invention is approximately 1.0 VDC, or approximately 2.5 times the threshold voltage. By using a much smaller supply voltage, present invention circuits consume significantly less power than prior art circuits.

Present invention circuits can switch between a logical low and a logical high very quickly due to the precharge state having an intermediate output voltage which is approximately halfway between the supply voltage and the Vss voltage. By setting the state of the output to this intermediate output voltage during the precharge phase, the voltage swing on the output to go to a logical high or a logical low is half the supply voltage. This swing is accomplished very quickly during the evaluation phase.

Figure 1:
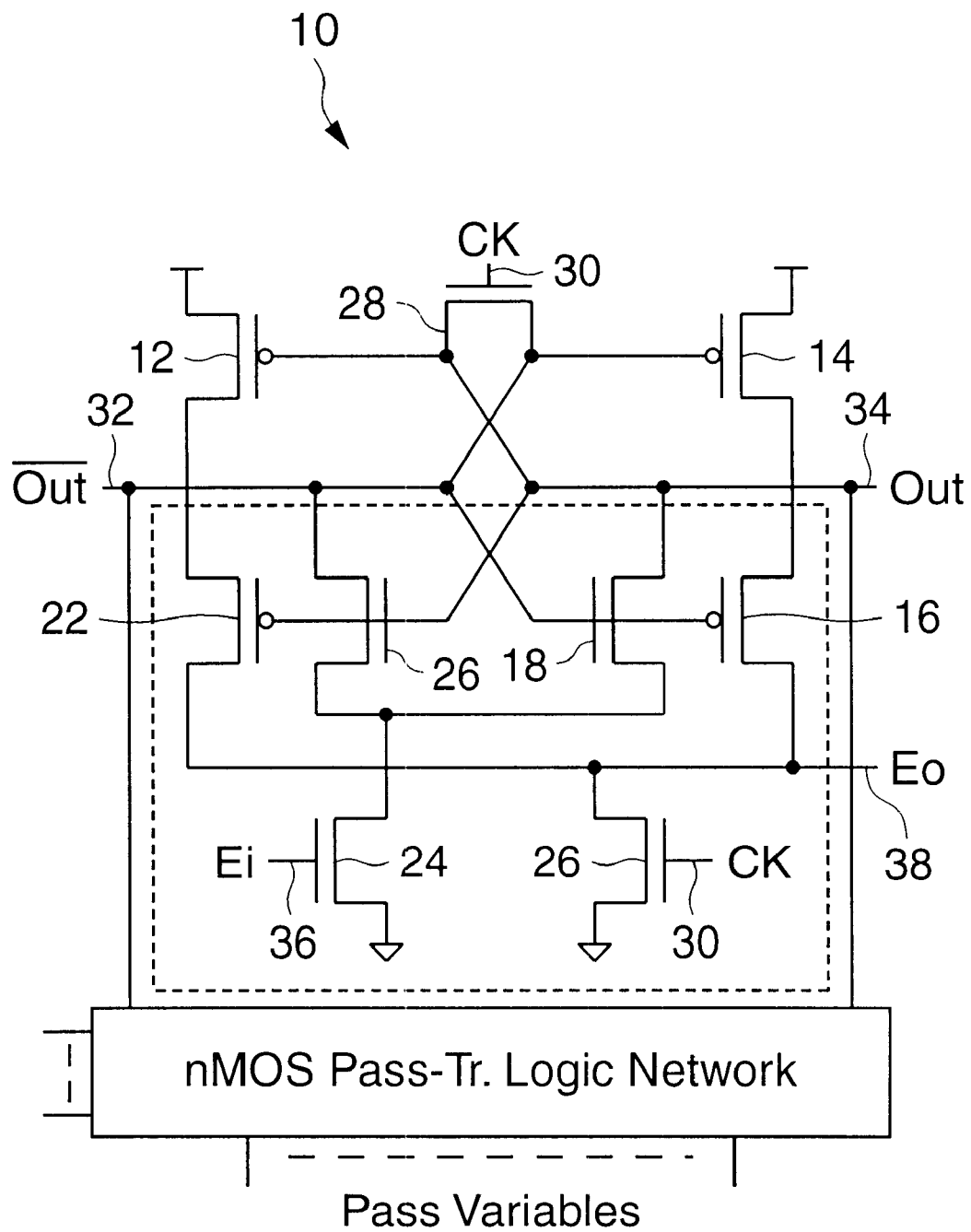
FIG. 1 is a schematic of a prior art CRDL circuit.
Figure 2:
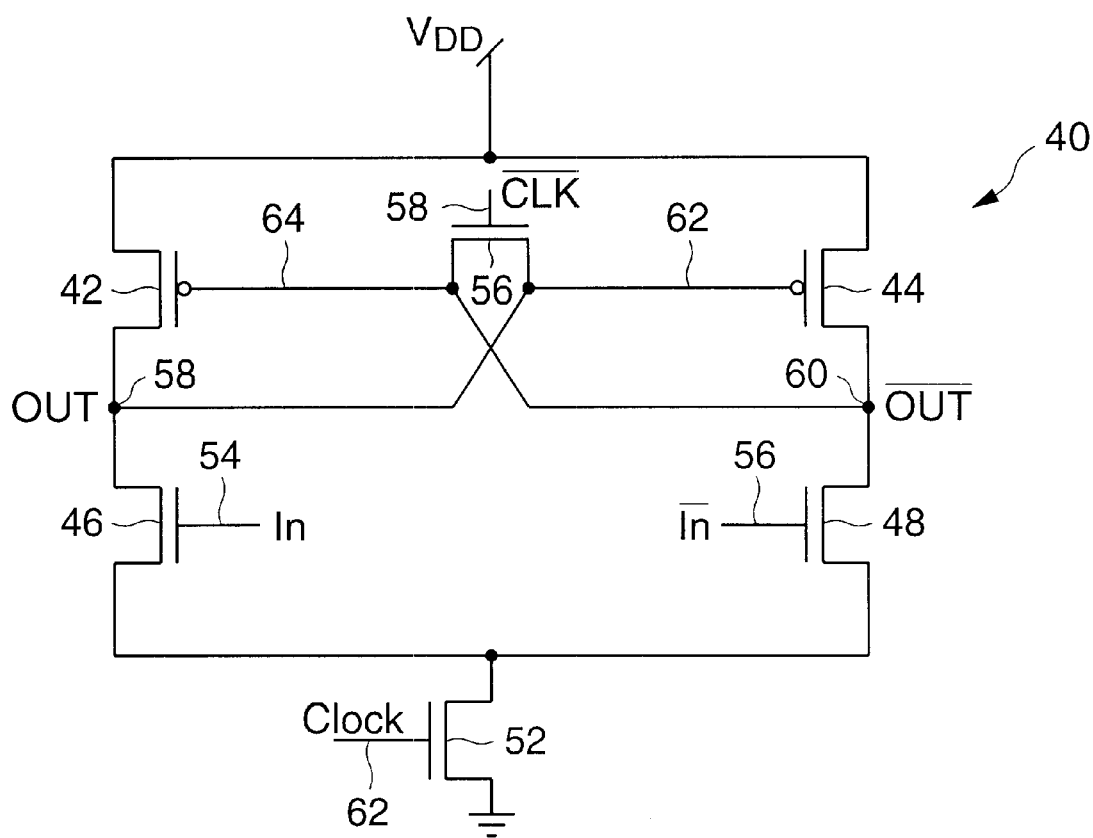
FIG. 2 is a schematic diagram of a present invention low voltage differential circuit.

FIG. 2 is a schematic diagram of a present invention low voltage differential circuit.

Referring to FIG. 2, differential inverter circuit 40 includes PMOS transistors 42 and 44, and NMOS transistors 46, 48, 50, and 52. The gate of transistor 52 is coupled to a standard clock signal, and the gate of transistor 50 is coupled to its complement. The gates of transistors 46 and 48 are also somewhat complementary. When gate 54 of transistor 46 is high, gate 56 of transistor 48 is low. However, during the precharge phase, gates 54 and 56 are each at a potential of approximately $V_{DD}/2$, causing each of transistors 46 and 48 to be partially turned on. There is no current flow through either of the two transistors 46 or 48, due to transistor 52 being turned off. Also during the precharge phase, nodes 58 and 60 becomes stabilized at a voltage of $V_{DD}/2$.

At some point in time, the evaluation phase begins when the clock signal at input 62 goes high. At the same time that input 62 goes high, input 58 goes low. Thus, transistor 52 turns on, and transistor 50 turns off. Now, assume input 54 goes high and the corresponding complementary input 56 goes low. At this point, transistor 48 turns completely off, and transistor 46 turns completely on, thus discharging node 58 through transistor 46.

Node 58 had previously been at a potential of $V_{DD}/2$ causing transistor 44 to be partially turned on. As node 58 discharges, the potential on gate 66 of transistor 44 decreases, thus causing transistor 44 to completely turn on, charging node 60 to a potential of $V_{DD}$. At the same time, transistor 42 completely turns off.

Figure 3:
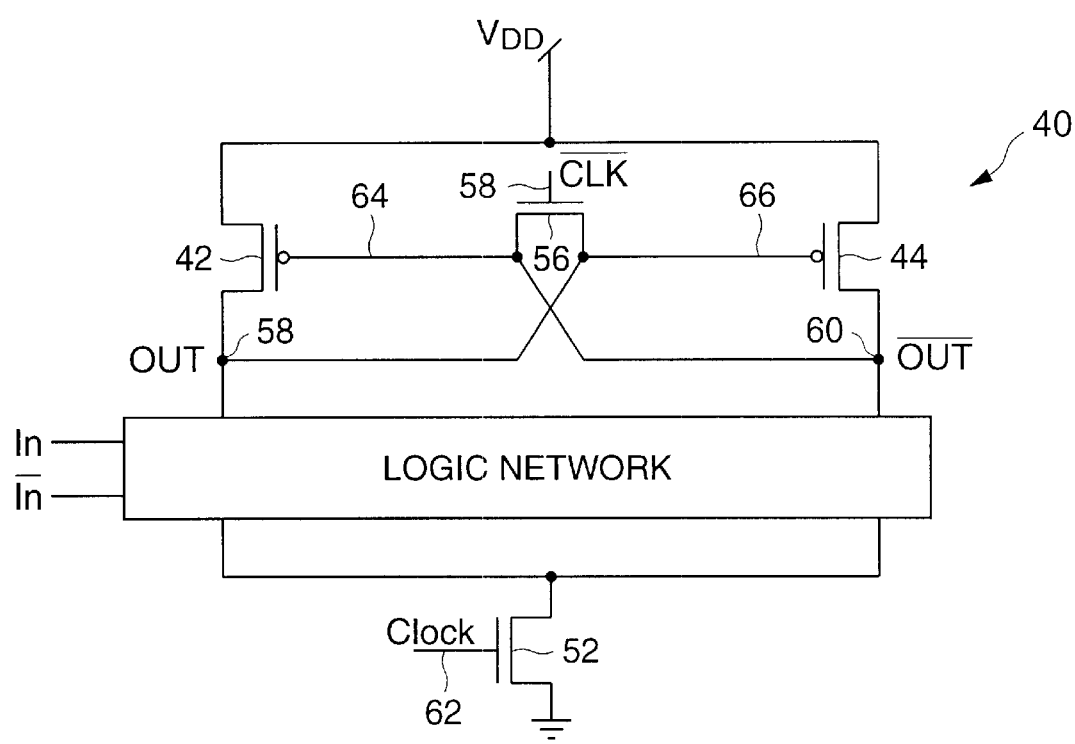
FIG. 3 is a schematic diagram of the embodiment of FIG. 2 having a generalized logic tree.

As depicted, the FIG. 2 embodiment is a simple inverter. Those of ordinary skill in the art having the benefit of this disclosure will readily appreciate that transistors 46 and 48 may be replaced by complex complementary logic circuits which perform significantly more complex logical functions. A generalized embodiment depicting the circuit of FIG. 2 having a generalized logic tree is seen in FIG. 3.

Figure 4:
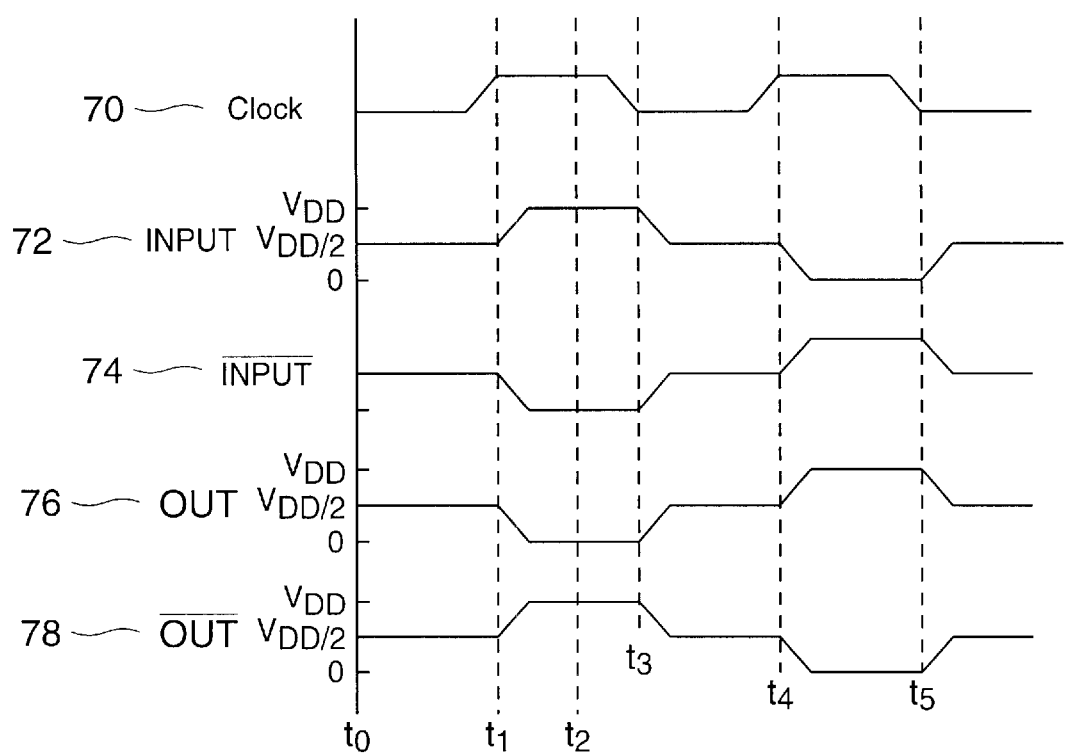
FIG. 4 shows time phased signal traces for the circuit of FIG. 2.

FIG. 4 shows time phased signal traces for the circuit of FIG. 2.

Referring to FIG. 4, between times to and ti, clock signal 70 is low signaling that inverter 50 is in the precharge phase. During this time, complementary inputs 72 and 74 and complementary outputs 76 and 78 are at a potential of $V_{DD}/2$.

Between times $t_1$ and $t_2$, input signal 72 goes high and complementary input 74 goes low. Clock signal 70 is also high at this time. Output signal 76 goes low and complementary output signal 78 goes high, both in response to the high input signal. Note that input 72 may go high anytime prior to or during the time that clock 70 is high, in order to produce a corresponding output signal 76.

At some time $t_3$, clock signal 70 goes low signaling another precharge cycle. At this time, input signals 72 and 74 and output signals 76 and 78 return to the precharge potential of $V_{DD}/2$.

At some time $t_4$, clock signal 70 again goes high. Sometime afterwards, but prior to time $t_5$ where clock signal 70 goes low, input signal 72 goes low, causing output signal 76 to go high and output signal 78 to go low.

Those of ordinary skill in the art having to the benefit of this disclosure will readily appreciate that the circuit of FIG. 2 accomplishes output signal transitions very quickly due to the small changes in voltages that are required.

Figure 5:
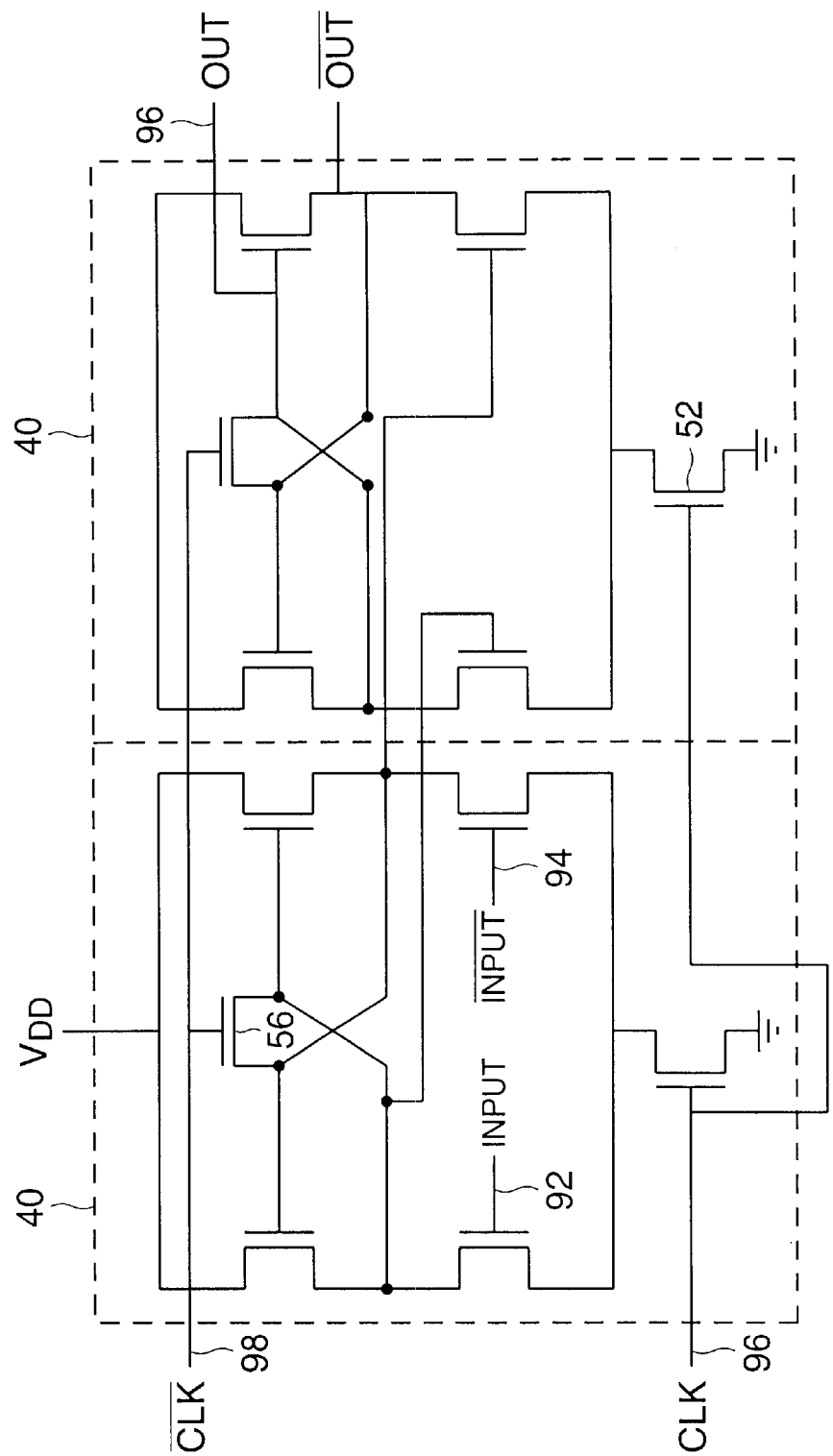
FIG. 5 is a schematic diagram of a chain of two inverters according to the present invention.

FIG. 5 is a schematic diagram of a chain of two inverters according to the present invention.

Referring to FIG. 5, system 90 includes two identical inverters 40, coupled together. In order to operate system 90, an input and its complement are provided to inputs 92 and 94 respectively. When the clock signal on clock input 96 is low and its complement on input 98 is high, system 90 is in the precharge phase. Correspondingly when the clock signal on clock input 96 is high and its complement on input 98 is low, system 90 is in the evaluate phase. The input signal on input 92 will propagate to output 96.

Those of ordinary skill in the art having the benefit of this disclosure will readily realize that the embodiments just described are simple examples of a wide range of circuits which may be designed according to the present invention, thus using lower voltage threshold levels and lower supply voltages. For example, transistors 46 and 48 may be replaced with complementary AND gates, OR gates, etc., in order to perform desired logic functions.

Such skilled persons will also appreciate that stages which perform different logic functions may be connected together. For example, an inverter circuit such as inverter 40 may precede an AND or OR logic circuit.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A low voltage differential circuit comprising:
    a complementary logic tree having first, second and third inputs and two outputs, the logic tree for performing a desired logical function on signals received at said first input, thereby opening a pathway for current flow between at least one of the following: said second input and said first output, said second input and said second output, said third input and said first output, said third input and said second output;
    a first transistor having a first gate, a first source, and a first drain, said first drain connected to said first output, said first source being connected to a supply voltage;
    a second transistor having a second gate, a second source, and a second drain, said second source connected to said first gate, said second drain connected to said first drain; and
    a third transistor having a third gate, a third source, and a third drain, said third source being connected to said supply voltage, said third gate being connected to said second drain, said third drain connected to said second source and said second output,
    wherein said supply voltage is between approximately 2.1 to 2.8 times the threshold voltage of said first, second and third transistors.

2. The low voltage differential circuit of claim 1 further including
    a fourth transistor having a fourth gate, a fourth source, and a fourth drain, said fourth drain being connected to said complementary logic tree, and said fourth source being connected to $V_{ss}$.

3. The low voltage differential circuit of claim 1 wherein said complementary logic tree performs at least one AND operation.

4. The low voltage differential circuit of claim 1 wherein said complementary logic tree performs at least one NAND operation.

5. The low voltage differential circuit of claim 1 wherein said complementary logic tree performs at least one OR operation.

6. The low voltage differential circuit of claim 1 wherein said complementary logic tree performs at least one NOR operation.

7. The low voltage differential circuit of claim 1 wherein said complementary logic tree performs at least one inversion operation.

8. The low voltage differential circuit of claim 1 wherein said supply voltage is between approximately 2.1 to 2.8 times the threshold voltage of said fourth transistor.

9. The low voltage differential circuit of claim 1 wherein said supply voltage is approximately 1.0 volt.

10. A low voltage differential circuit comprising:
    a complementary logic tree having first, second and third inputs and two outputs, the logic tree for performing a desired logical function on signals received at said first input, thereby opening a pathway for current flow between at least one of the following: said second input and said first output, said second input and said second output, said third input and said first output, said third input and said second output;

a first transistor having a first gate, a first source, and a first drain, said first drain connected to said first output, said first source being connected to a supply voltage;

a second transistor having a second gate, a second source, and a second drain, said second source connected to said first gate, said second drain connected to said first drain; and a third transistor having a third gate, a third source, and a third drain, said third source being connected to said supply voltage, said third gate being connected to said second drain, said third drain connected to said second source and said second output, wherein said supply voltage is approximately 2.5 times the threshold voltage of said first, second and third transistors.

11. The low voltage differential circuit of claim 10, wherein said supply voltage is approximately 1.0 volt.

12. The low voltage differential circuit of claim 10 further including a fourth transistor having a fourth gate, a fourth source, and a fourth drain, said fourth drain being connected to said complementary logic tree, and said fourth source being connected to $V_{ss}$.

13. The low voltage differential circuit of claim 10 wherein said complementary logic tree performs at least one AND operation.

14. The low voltage differential circuit of claim 10 wherein said complementary logic tree performs at least one NAND operation.

15. The low voltage differential circuit of claim 10 wherein said complementary logic tree performs at least one OR operation.

16. The low voltage differential circuit of claim 10 wherein said complementary logic tree performs at least one NOR operation.

17. The low voltage differential circuit of claim 10 wherein said complementary logic tree performs at least one inversion operation.

18. The low voltage differential circuit of claim 10 wherein said supply voltage is between approximately 2.1 to 2.8 times the threshold voltage of said fourth transistor.

* * * * *